(12) United States Patent
Ko et al.

(10) Patent No.: US 12,439,790 B2
(45) Date of Patent: Oct. 7, 2025

(54) THIN FILM TRANSISTOR ARRAY SUBSTRATE AND ELECTRONIC DEVICE INCLUDING THE SAME

(71) Applicant: LG DISPLAY CO., LTD., Seoul (KR)

(72) Inventors: Younghyun Ko, Paju-si (KR); ChanYong Jeong, Paju-si (KR)

(73) Assignee: LG Display Co., Ltd (KR)

(*) Notice: Subject to any disclaimer, the term of this patent is extended or adjusted under 35 U.S.C. 154(b) by 1106 days.

(21) Appl. No.: 17/387,342

(22) Filed: Jul. 28, 2021

(65) Prior Publication Data

US 2022/0130944 A1    Apr. 28, 2022

(30) Foreign Application Priority Data

Oct. 27, 2020    (KR) .................. 10-2020-0140671

(51) Int. Cl.
| | |
|---|---|
| *H10K 59/131* | (2023.01) |
| *H10K 71/00* | (2023.01) |
| *H10K 59/12* | (2023.01) |
| *H10K 71/40* | (2023.01) |

(52) U.S. Cl.
CPC ......... *H10K 59/1315* (2023.02); *H10K 71/00* (2023.02); *H10K 59/1201* (2023.02); *H10K 71/40* (2023.02)

(58) Field of Classification Search
CPC ............. H10K 59/1315; H10K 59/121; H10K 59/1201; H10K 71/00; H10K 71/40; H01L 29/78696; H01L 29/78621; H01L 27/1237

See application file for complete search history.

(56) References Cited

U.S. PATENT DOCUMENTS

| | | | |
|---|---|---|---|
| 9,202,896 B2* | 12/2015 | Yoon ................. | H01L 29/66969 |
| 2012/0319102 A1* | 12/2012 | Yamazaki ......... | H10F 39/80377 |
| | | | 257/E29.296 |
| 2015/0187878 A1* | 7/2015 | Yamazaki .......... | H01L 27/1251 |
| | | | 257/43 |
| 2016/0254368 A1 | 9/2016 | Jiang et al. | |

FOREIGN PATENT DOCUMENTS

KR    10-2020-0082310 A    7/2020

OTHER PUBLICATIONS

Korean Office Action dated Apr. 2, 2024 issued in Patent Application No. 10-2020-0140671(6 pages).

* cited by examiner

*Primary Examiner* — Eric K Ashbahian
(74) *Attorney, Agent, or Firm* — Fish & Richardson P.C.

(57) ABSTRACT

A thin film transistor array substrate comprises a panel including the thin film transistor array substrate, and an electronic device including the panel that includes a conductive auxiliary layer disposed on the substrate, a gate electrode and first and second electrodes that are disposed on the conductive auxiliary layer and spaced apart from one another, a gate insulating film disposed on the gate electrode, and an active layer disposed on or over the gate insulating film and the first and second electrodes, and including a first region, a second region spaced apart from the first region, a first auxiliary region surrounding the first region, and a second auxiliary region surrounding the second region, where an electrical resistance of each of the first auxiliary region and the second auxiliary region is lower than that of the channel region and higher than that of each of the first and second regions.

20 Claims, 17 Drawing Sheets

THIN FILM TRANSISTOR ARRAY SUBSTRATE AND ELECTRONIC DEVICE INCLUDING THE SAME

CROSS-REFERENCE TO RELATED APPLICATION

This application claims the benefit of the Korea Patent Application No. 10-2020-0140671, filed on Oct. 27, 2020, which is hereby incorporated by reference in its entirety.

BACKGROUND

Field of the Disclosure

The present disclosure relates to a thin film transistor array substrate and an electronic device including the thin film transistor array substrate.

Description of the Background

As the advent of information society, there have been growing needs for various types of electronic devices, such as display devices, lighting devices, and the like are. Such electronic devices include a panel in which data lines and gate lines are disposed, a data driver for driving the data lines, and a gate driver for driving the gate lines.

Generally, a plurality of transistors with various functions for driving is arranged in the panel that is a core element of such electronic devices.

Due to this, a process of manufacturing the panel becomes inevitably complicated and difficult. Meanwhile, in case of focusing on process convenience, the performance of circuit components such as transistors, and the like can be deteriorated.

Accordingly, there is a need to provide transistors having a structure in which a related process can be simplified and the performance thereof can be prevented from being degraded.

SUMMARY

The present disclosure provides a thin film transistor array substrate having a structure capable of preventing an active layer from being damaged by plasma when a process for modifying the active layer to act as a conductor is performed by enabling the active layer to include a region contacting each of a first electrode and a second electrode, and an electronic device including the thin film transistor array substrate.

Also, the present disclosure provides a thin film transistor array substrate having a structure in which current characteristics can be maintained without being changed by including a plurality of auxiliary regions having an electrical resistance lower than that of a channel region, and an electronic device including the thin film transistor array substrate.

Further, the present disclosure provides a thin film transistor array substrate capable of simplifying a related process by disposing a gate electrode, a first electrode and a second electrode in the same layer, and an electronic device including the thin film transistor array substrate.

According to one aspect of the present disclosure, there are provided a thin film transistor array substrate, a panel including the thin film transistor array substrate, and an electronic device including the thin film transistor array substrate and/or the panel, the electronic device including the panel including at least one thin film transistor, and a driving circuit for driving the panel. The panel can include a substrate, a conductive auxiliary layer, which may be made up of at least one layer, disposed on the substrate, a gate electrode and first and second electrodes that are disposed on the conductive auxiliary layer and spaced apart from one another, a gate insulating film disposed on the gate electrode, and an active layer disposed on or over the gate insulating film and the first and second electrodes, and including a first region, a second region spaced apart from the first region, a channel region disposed between the first region and the second region, a first auxiliary region extending from the first region and spaced apart from the channel region, and a second auxiliary region extending from the second region and spaced apart from the channel region. In this situation, an electrical resistance of each of the first auxiliary region and the second auxiliary region is lower than that of the channel region and higher than that of each of the first and second regions.

According to another aspect of the present disclosure, there are provided a thin film transistor array substrate, a panel including the thin film transistor array substrate, and an electronic device including the thin film transistor array substrate and/or the panel, the panel including a substrate, a conductive auxiliary layer, which may be made up of at least one layer, disposed on the substrate, a gate electrode disposed on the conductive auxiliary layer, first and second electrodes disposed in the same layer as the gate electrode and spaced apart from each other, a gate insulating film disposed on the gate electrode, and an active layer disposed on or over the gate insulating film and the first and second electrodes, and including a first region, a second region spaced apart from the first region, a channel region disposed between the first region and the second region, a first auxiliary region surrounding the first region, and a second auxiliary region surrounding the second region. In this situation, an electrical resistance of each of the first auxiliary region and the second auxiliary region is lower than that of the channel region and higher than that of each of the first and second regions.

According to the present disclosure, it is possible to provide a thin film transistor array substrate having a structure capable of preventing an active layer from being damaged by plasma when a process for modifying the active layer to act as a conductor is performed by enabling the active layer to include a region contacting each of a first electrode and a second electrode, and an electronic device including the thin film transistor array substrate.

Also, according to the present disclosure, it is possible to provide a thin film transistor array substrate having a structure in which current characteristics can be maintained without being changed by including a plurality of auxiliary regions having an electrical resistance lower than that of a channel region, and an electronic device including the thin film transistor array substrate.

Further, according to the present disclosure, it is possible to provide a thin film transistor array substrate capable of simplifying a related process by disposing a gate electrode, a first electrode and a second electrode in the same layer, and an electronic device including the thin film transistor array substrate.

BRIEF DESCRIPTION OF THE DRAWINGS

The accompanying drawings, which are included to provide a further understanding of the disclosure and are incorporated in and constitute a part of the disclosure, In the drawings.

BRIEF DESCRIPTION OF THE DRAWINGS

Figure 1:
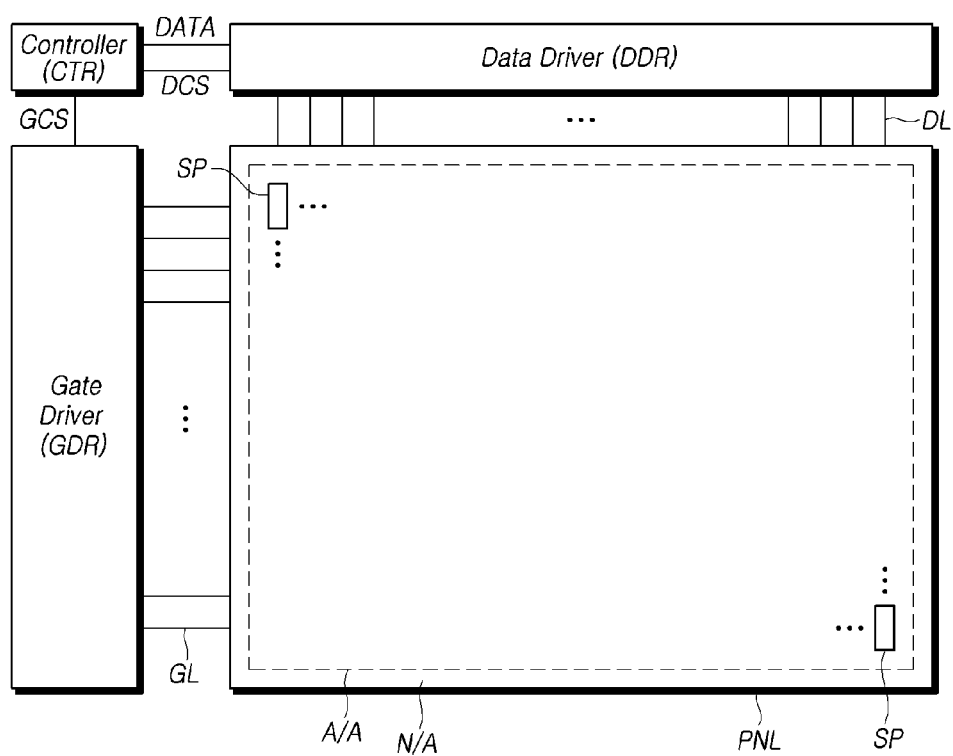
FIG. 1 schematically illustrates a system configuration of an electronic device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, exemplary aspects of the present disclosure will be described in detail with reference to the accompanying drawings.

FIG. 1 schematically illustrates a system configuration of an electronic device according to aspects of the present disclosure.

Electronic devices according to aspects of the present disclosure may include a display device, a lighting device, a light emitting device, and the like. Hereinafter, for convenience of description, aspects of the present disclosure will be described by focusing on display devices. However, it should be appreciated that as long as a transistor is included, aspects described herein may be applicable to other various electronic devices, such as lighting devices, light emitting devices, and the like, as well as display devices.

The electronic device according to aspects of the present disclosure includes a panel PNL that displays an image or outputs light, and a driving circuit for driving the panel PNL.

The panel PNL may include a plurality of data lines DL and a plurality of gate lines GL, and a plurality of sub-pixels SP defined by the plurality of data lines DL and the plurality of gate lines GL, and arranged in a matrix pattern.

The plurality of data lines DL and the plurality of gate lines GL may be arranged to intersect each other in the panel PNL. In an aspect, the plurality of gate lines GL may be arranged in rows or columns, and the plurality of data lines DL may be arranged in columns or rows. Hereinafter, for convenience of description and ease of understanding, it is assumed that the plurality of gate lines GL is arranged in rows and the plurality of data lines DL is arranged in columns.

In addition to the plurality of data lines DL and the plurality of gate lines GL, one or more other types of signal lines may be arranged in the panel PNL according to sub-pixel structures or the like. A driving voltage line, a reference voltage line, or a common voltage line may be further disposed.

The panel PNL may be one of various types of panels, such as a liquid crystal display (LCD) panel, an organic light emitting diode (OLED) panel, an electroluminescence display (ELD) panel, a quantum-dot (QD) light emitting display panel, and the like.

The types of signal lines arranged on the panel PNL may be different depending on a sub-pixel structure, a panel type (e.g., an LCD panel, an OLED panel, etc.), and the like. Herein, the signal lines may include an electrode to which a signal is applied. In an aspect, at least a part of the signal lines may serve as an electrode to which a signal The panel PNL can include an active area A/A on which images are displayed, and a non-active area N/A that is an outer edge, on which images are not displayed. Here, the non-active area N/A is sometimes referred to as a bezel area.

A plurality of sub-pixels SP for image display is arranged in the active area A/A.

A pad portion including one or more conductive pads may be disposed in the non-active area N/A for an electrically connection with a data driver DDR, and a plurality of data link lines may be disposed in the non-active area N/A for electrically connecting between the pad portion and a plurality of data lines DL. Here, the plurality of data link lines may be parts of the plurality of data lines DL extending up to the non-active area N/A (e.g., from the active area A/A), or may be separate patterns electrically connected to the plurality of data lines DL.

Further, gate driving related lines may be arranged in the non-active area N/A to transmit a voltage (signal) needed for gate driving to a gate driver GDR through the pad portion to which the data driver DDR is electrically connected. In an aspect, such gate driving related lines may include clock lines for carrying clock signals, gate voltage lines for transmitting gate voltages (VGH, VGL), and gate driving control signal lines for carrying various types of control signals required for generating scan signals. The gate driving related lines may be arranged in the non-active area N/A, differently from the gate lines GL disposed in the active area A/A.

The driving circuit may include a data driver DDR for driving a plurality of data lines DL, a gate driver GDR for driving a plurality of gate lines GL, and a controller CTR for controlling the data driver DDR and the gate driver GDR.

The data driver DDR can drive the plurality of data lines DL by applying data voltages to the plurality of data lines DL.

The gate driver GDR can drive the plurality of gate lines GL by supplying scan signals to the plurality of gate lines GL.

The controller CT) can control driving operations of the data driver DDR and the gate driver GDR by supplying various types of control signals (DCS, GCS) required for the driving operations of the data driver DDR and the gate driver GDR. Further, the controller CTR can supply image data DATA to the data driver DDR.

The controller CTR can start to scan a pixel according to a timing scheduled in each frame, convert image data inputted from the outside (e.g., a host system, other devices or other image providing sources) to a data signal type used in the data driver DDR and then output image data DATA resulting from the converting to the data driver DDR, and causes the data to be written into the pixel at a preconfigured time according to scan operation.

To control the data driver DDR and the gate driver GDR, the controller CTR can receive, from the outside (e.g., the host system, other devices or other image providing sources), timing signals, such as, a vertical synchronization signal Vsync, a horizontal synchronization signal Hsync, an input data enable (DE) signal, a clock signal, and the like. The controller CTR can generate various types of control signals using the received signals and supply such generated signals to the data driver DDR and the gate driver GDR.

In an aspect, to control the gate driver GDR, the controller CTR can output several types of gate control signals GCS including a gate start pulse GSP, a gate shift clock GSC, a gate output enable signal GOE, and the like.

Further, to control the data driver DDR, the controller CTR can output several types of data control signals DCS including a source start pulse SSP, a source sampling clock SSC, a source output enable signal SOE, and the like.

The controller CTR may be a timing controller used in the typical display technology or a control apparatus/device capable of additionally performing other control functions in addition to the typical function of the timing controller.

The controller CTR may be implemented in a separate component from the data driver DDR or may be integrated with the data driver DDR into an integrated circuit.

The data driver DDR can drive a plurality of data lines DL by receiving image data DATA from the controller CTR and then supplying data voltages corresponding to the image data to the plurality of data lines DL. Here, the data driver DDR is sometimes referred to as a source driving circuit or a source driver.

The data driver DDR can transmit various signals to, or receive various signals from, the controller CTR through various interfaces.

The gate driver GDR can sequentially drive a plurality of gate lines GL by sequentially supplying scan signals to the plurality of gate lines GL. Here, the gate driver GDR is sometimes referred to as a scan driving circuit or a scan driver.

According to the control of the controller CTR, the gate driver GDR can sequentially supply scan signals representing an on-voltage or an off-voltage to the plurality of gate lines GL.

When a specific gate line is asserted by a scan signal from the gate driver GDR, the data driver DDR can convert image data DATA received from the controller CTR into analog data voltages and supply the obtained data voltages to the plurality of data lines DL.

The data driver DDR may be located on, but not limited to, only one side (e.g., an upper side or a lower side) of the panel PNL, or in some aspects, be located on, but not limited to, two sides (e.g., the upper side and the lower side) of the panel PNL according to driving schemes, design schemes of the panels, or the like.

The gate driver GDR may be located on, but not limited to, only one side (e.g., a left side or a right side) of the panel PNL, or in some aspects, be located on, but not limited to, two sides (e.g., the left side and the right side) of the panel PNL according to driving schemes, design schemes of the panels, or the like.

The data driver DDR may be implemented by including one or more source driver integrated circuits SDIC.

Each source driver integrated circuit SDIC may include a shift register, a latch circuit, a digital-to-analog converter DAC, an output buffer, and the like. In some aspects, the data driver DDR may further include one or more analog-to-digital converters ADC.

Each source driver integrated circuit SDIC may be connected to a conductive pad such as a bonding pad of the panel PNL in a tape automated bonding (TAB) type or a chip on glass (COG) type, or be directly disposed on the panel 110. In some aspects, each source driver integrated circuit SDIC may be disposed in the panel PNL in an integrated type. In some aspects, each source driver integrated circuit SDIC may be implemented in a chip on film (COF) type. In this aspect, each source driver integrated circuit SDIC may be mounted on a circuit film, and electrically connected to data lines DL in the panel PNL through the circuit film.

The gate driver GDR may include a plurality of gate driving circuits GDC. The plurality of gate driving circuits GDC may correspond to a plurality of gate lines GL, respectively.

Each gate driving circuit GDC may include a shift register, a level shifter, and the like.

Each gate driving circuit GDC may be connected to a conductive pad such as a bonding pad of the panel PNL in the tape automated bonding (TAB) type or the chip on glass (COG) type. In some aspects, each gate driving circuit GDC may be implemented in the chip on film (COF) type. In this aspect, each gate driving circuit GDC may be mounted on a circuit film, and electrically connected to gate lines GL in the panel PNL through the circuit film. In another aspect, each gate driving circuit GDC may be implemented in a gate in panel (GIP) type and embedded in the panel PNL. That is, each gate driving circuit GDC may be directly formed in the panel PNL.

Figure 2:
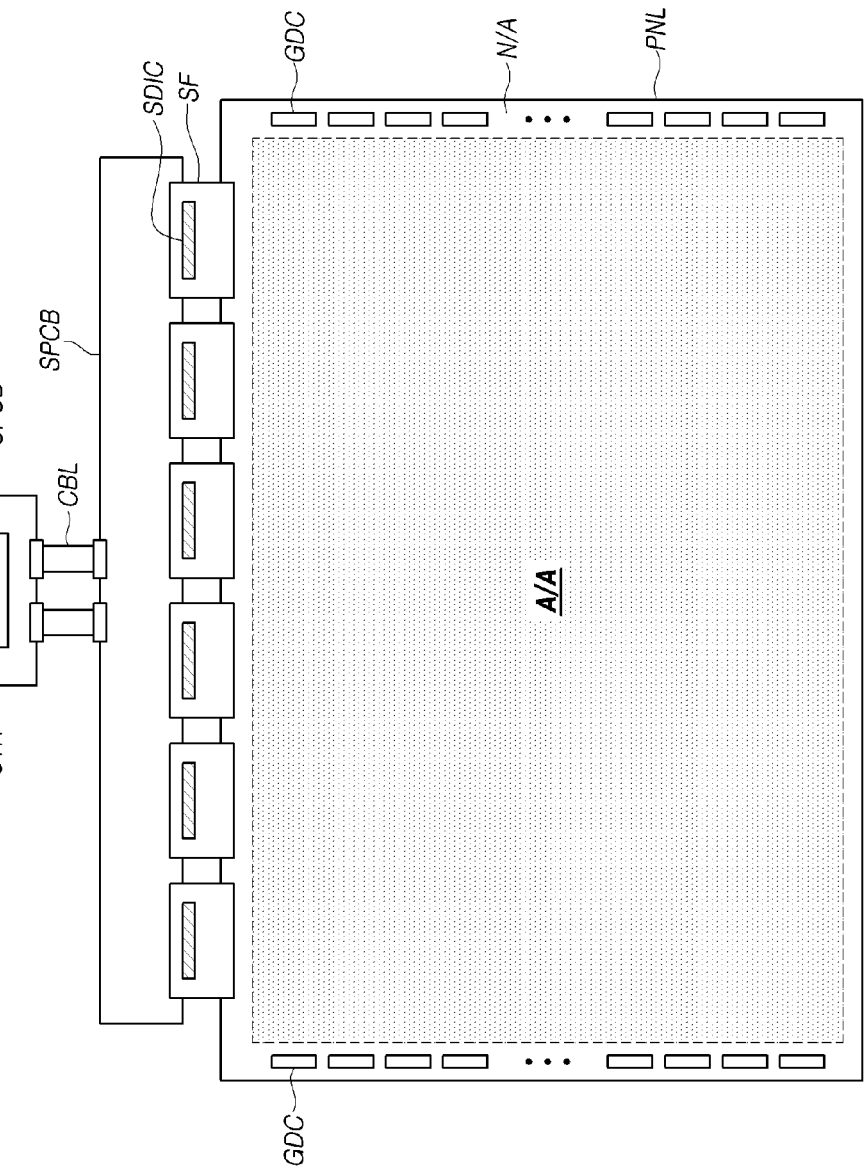
FIG. 2 illustrates an example system implementation of the display device according to aspects of the present disclosure.

FIG. 2 illustrates an example system implementation of the display device according to aspects of the present disclosure.

Referring to FIG. 2, in an electronic device according to aspects of the present disclosure, the data driver DDR may be implemented in the chip on film (COF) type of various types (TAB, COG, COF, etc.), and the gate driver GDR may be implemented in the gate in panel (GIP) type of various types (TAB, COG, COF, GIP, etc.).

The data driver DDR may be implemented as one or more source driver integrated circuits SDIC. FIG. 2 illustrates a situation in which the data driver DDR is implemented as a plurality of source driver integrated circuits SDIC.

When the data driver DDR is implemented in the COF type, each source driver integrated circuit SDIC implementing the data driver DDR may be mounted on the source-side circuit film SF.

One side of the source-side circuit film SF may be electrically connected to the pad portion (including one or more conductive pads) disposed in the non-active area N/A of the panel PNL.

Lines for electrically connecting between one or more source driver integrated circuits SDIC and the panel PNL may be disposed on the source-side circuit film SF.

The electronic device may include, for electrical connections between one or more source driver integrated circuits SDIC and other elements or devices, one or more source printed circuit boards SPCB, and a control printed circuit board CPCB for allowing control components and several types of electric elements or devices to be mounted.

The other side of the source-side circuit film SF on which the source driver integrated circuits SDIC are mounted may be connected to one or more source printed circuit boards SPCB.

That is, the one side of the source-side circuit film SF on which the source driver integrated circuits SDIC are mounted may be electrically connected to the non-active area N/A of the panel PNL, and the other side thereof may be electrically connected to one or more source printed circuit board SPCB.

The controller CTR that controls operations of the data driver DDR, the gate driver GDR, and the like may be disposed on the control printed circuit board CPCB.

A power management integrated circuit PMIC that supplies various levels of voltages or currents, or controls various levels of voltages or currents to be supplied, to the panel PNL, the data driver DDR, and the gate driver GDR etc., and the like may be further disposed on the control printed circuit board CPCB.

A circuital connection between one or more source printed circuit boards SPCB and the control printed circuit board CPCB may be performed through at least one connection member CBL. The connection member CBL may be, for example, a flexible printed circuit FPC, a flexible flat cable FFC, or the like.

One or more source printed circuit boards SPCB and the control printed circuit board CPCB may be integrated into one printed circuit board.

When the gate driver GDR is implemented in the gate In panel (GIP) type, one or more gate driving circuits GDC included in the gate driver GDR may be directly formed in the non-active area N/A of the panel PNL.

Each of the plurality of gate driving circuits GDC may supply a scan signal SCAN to a corresponding gate line GL disposed in the active area A/A of the panel PNL.

The plurality of gate driving circuits GDC disposed on the panel PNL can receive various signals (a clock signal, a high level gate voltage VGH, a low level gate voltage VGL, a start signal VST, a reset signal RST, and the like) which are needed for generating scan signals through gate driving-related lines disposed in the non-active area N/A.

The gate driving-related lines disposed in the non-active area N/A may be electrically connected to the source-side circuit film SF disposed closest to the plurality of gate driving circuits GDC.

Figure 3:
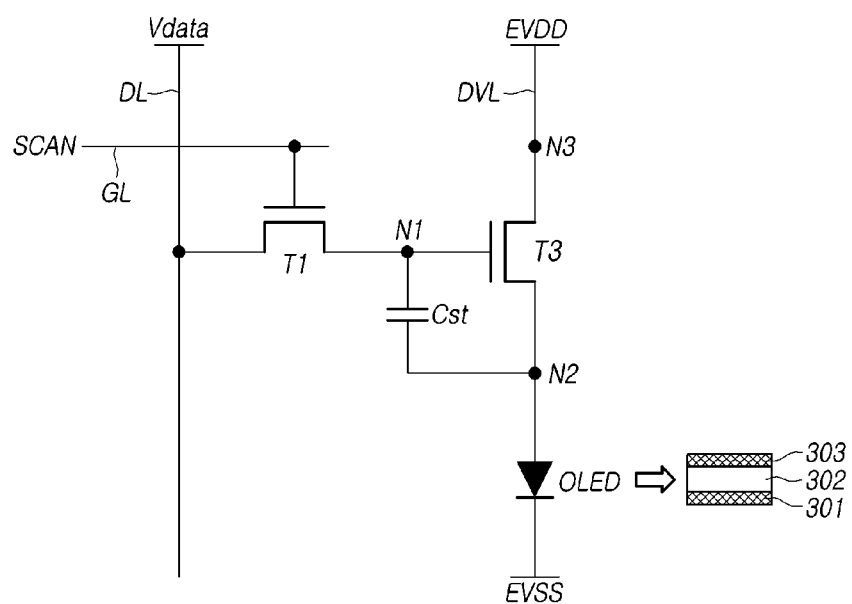
FIG. 3 illustrates a sub-pixel structure when a panel including organic light emitting diodes (OLED) is employed in the electronic device according to aspects of the present disclosure.

FIG. 3 illustrates a sub-pixel SP structure when an organic light emitting diode panel PNL including an organic light emitting diode (OLED) is employed in the electronic device according to aspects of the present disclosure.

Referring to FIG. 3, each sub-pixel SP in the organic light emitting diode panel PNL including the organic light emitting element may further include a first transistor T1 passing a data voltage Vdata to a first node N1 corresponding to a gate node of a driving transistor T3, and a storage capacitor Cst for maintaining the data voltage Vdata corresponding to an image signal voltage or a voltage corresponding to this during one frame time.

An organic light emitting element such as the organic light emitting diode (OLED) may include a first electrode 301 (anode electrode or cathode electrode), an organic layer 302 including at least one emission layer, a second electrode 303 (cathode electrode or anode electrode), and the like.

For example, a low-level voltage EVSS may be applied to the second electrode 303 of the organic light emitting diode OLED.

The driving transistor T3 can drive the organic light emitting diode OLED by supplying a driving current to the organic light emitting diode OLED.

The driving transistor T3 may have a first node N1, a second node N2, and a third node N3.

The first node N1 of the driving transistor T3 may be a node corresponding to the gate node thereof, and may be electrically connected to a source node or a drain node of the second transistor T1.

The second node N2 of the driving transistor T3 may be electrically connected to the first electrode 301 of the organic light emitting element OLED and may be a source node or a drain node.

The third node N3 of the driving transistor T3 may be the drain node or the source node as a node to which a driving voltage EVDD is applied, and may be electrically connected to a driving voltage line DVL for passing the driving voltage EVDD.

The driving transistor T3 and the first transistor T1 may be n-type transistors or p-type transistors.

The first transistor T1 may be electrically connected between a data line DL and the first node N1 of the driving transistor T3 and may be controlled by a scan signal SCAN that is carried through a gate line and applied to the gate node of the first transistor T1.

The first transistor T1 may be turned on by the scan signal SCAN and apply a data voltage Vdata passed through the data line DL to the first node N1 of the driving transistor T3.

The storage capacitor Cst may be electrically connected between the first node N1 and the second node N2 of the driving transistor T3.

The storage capacitor Cst is an external capacitor intentionally designed to be located outside of the driving transistor T3, other than an internal storage, such as a parasitic capacitor (e.g., a Cgs, a Cgd) that presents between the first node N1 and the second node N2 of the driving transistor T3.

It should be understood that the sub-pixel structure with two transistors (2T) and one capacitor (1C) shown in FIG. 3 is merely one example of possible sub-pixel structures for convenience of discussion, and aspects of the present disclosure may be implemented in any of various structures, as desired. For example, the sub-pixel may further include at least one transistor and/or at least one capacitor. In some aspects, each of a plurality of sub-pixels may have the same structure, or some of the plurality of sub-pixels may have a different structure.

Figure 4:
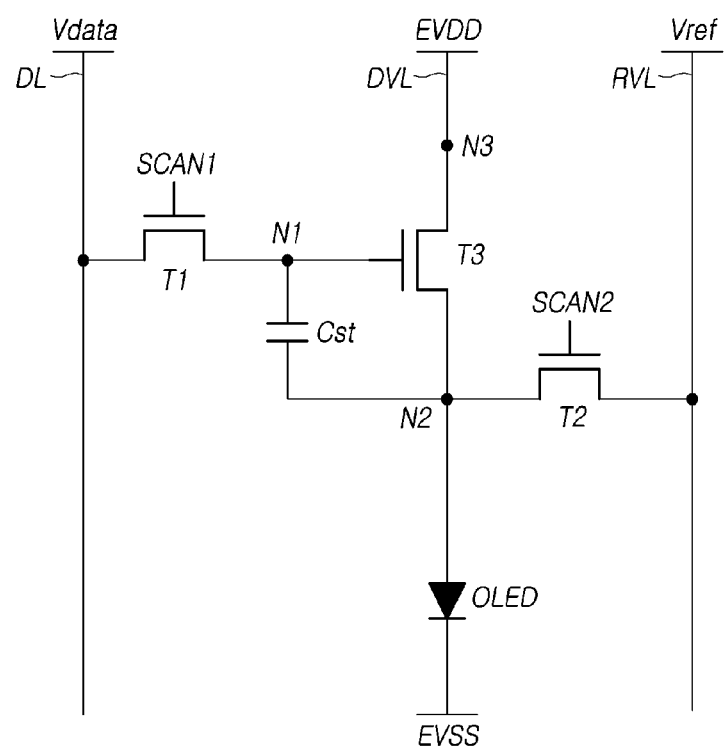
FIG. 4 illustrates a three transistors (3T) and one capacitor (1C) structure in which one sub-pixel further includes a second transistor electrically connected between a second node of a driving transistor and a reference voltage line according to aspects of the present disclosure.

FIG. 4 illustrates a three transistors (3T) and one capacitor (1C) structure in which one sub-pixel further includes a second transistor electrically connected between the second node N2 of the driving transistor and a reference voltage line RVL according to aspects of the present disclosure.

Referring to FIG. 4, the second transistor T2 may be electrically connected between the second node N2 of the driving transistor T3 and the reference voltage line RVL. On-off operations of the second transistor T2 can be controlled by a second scan signal SCAN2 applied to the gate node of the second transistor T2.

A drain node or a source node of the second transistor T2 may be electrically connected to the reference voltage line RVL, and the source node or the drain node of the second transistor T2 may be electrically connected to the second node of the driving transistor T3.

The second transistor T2, for example, may be turned on in a duration in which display driving is performed, and turned on in a duration in which sensing driving is performed for sensing a characteristic value of the driving transistor T3 or a characteristic value of the organic light emitting diode (OLED).

The second transistor T2 may be turned on by the second scan signal SCAN2 and pass a reference voltage Vref applied to the reference voltage line RVL to the second node N2 of the driving transistor T3, according to a corresponding driving timing (e.g., a display driving timing or an initial timing within a time period for the sensing driving).

The second transistor T2 may be turned on by the second scan signal SCAN2 and pass the voltage at the second node N2 of the driving transistor T3 to the reference voltage line RVL, according to a corresponding driving timing (e.g., a sampling timing within the time period for the sensing driving).

In other words, the second transistor T2 can control a voltage status at the second node N2 of the driving transistor T3, or pass the voltage at the second node N2 of the driving transistor T3 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driving circuit DDR.

The sensing data output from the analog-to-digital converter may be used to sense a characteristic value of the driving transistor T3 (e.g., a threshold voltage, mobility, etc.) or a characteristic value of the organic light emitting diode (OLED) (e.g., a threshold voltage, etc.).

Meanwhile, the capacitor Cst is an external capacitor intentionally designed to be located outside of the driving transistor T3, other than an internal, such as a parasitic capacitor (e.g., a Cgs, a Cgd) that presents between the first node N1 and the second node N2 of the driving transistor T3.

Each of the driving transistor T3, the first transistor T1, and the second transistor T2 may be an n-type transistor or a p-type transistor.

Meanwhile, the first scan signal SCAN1 and the second scan signal SCAN2 may be separate gate signals. In this aspect, the first scan signal SCAN1 and the second scan signal SCAN2 respectively may be applied to the gate node of the first transistor T1 and the gate node of the second transistor T2 through different gate lines.

In some aspect, the first scan signal SCAN1 and the second scan signal SCAN2 may be the same gate signal. In this aspect, the first scan signal SCAN1 and the second scan signal SCAN2 may be commonly applied to the gate node of the first transistor T1 and the gate node of the second transistor T2 through the same gate line.

It should be understood that the sub-pixel structures illustrated in FIGS. 3 and 4 are merely examples of possible sub-pixel structures for convenience of discussion, and aspects of the present disclosure may be implemented in any of various structures, as desired. For example, the sub-pixel may further include at least one transistor and/or at least one capacitor.

In some aspects, each of a plurality of sub-pixels may have the same structure, or some of the plurality of sub-pixels may have a different structure.

Figure 5:
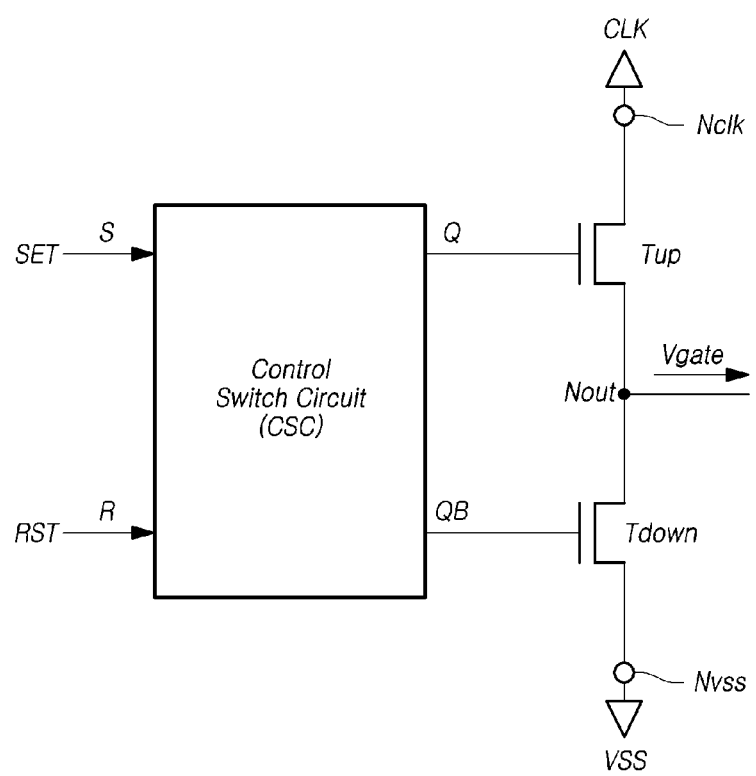
FIG. 5 illustrates a gate driving circuit disposed in the panel according to aspects of the present disclosure.

FIG. 5 illustrates one gate driving circuit GDC disposed in the panel according to aspects of the present disclosure.

Referring to FIG. 5, each of the plurality of gate driving circuits GDC may include a pull-up transistor Tup, a pull-down transistor Tdown, and a control switch circuit CSC.

The control switch circuit CSC is a circuit for controlling a voltage at node Q corresponding to the gate node of the pull-up transistor Tup and a voltage at node QB corresponding to the gate node of the pull-down transistor Tdown, and may include a plurality of switches (e.g., transistors).

The pull-up transistor Tup is a transistor that supplies a gate signal Vgate corresponding to a first level voltage (e.g. a high level voltage VGH) to a gate line GL through a gate signal output node Nout. The pull-down transistor Tdown is a transistor that supplies a gate signal Vgate corresponding to a second level voltage (e.g. a low level voltage VGL) to the gate line GL through the gate signal output node Nout. The pull-up transistor Tup and the pull-down transistor Tdown may be turned on at different timings.

The pull-up transistor Tup may be electrically connected between a clock signal applying node Nclk to which a clock signal CLK is applied and the gate signal output node Nout electrically connected to the gate line GL, and can be turned on or off by the voltage at node Q.

The gate node of the pull-up transistor Tup is electrically connected to node Q. The drain node or the source node of the pull-up transistor Tup is electrically connected to the clock signal applying node Nclk. The source node or drain node of the pull-up transistor Tup is electrically connected to the gate signal output node Nout from which a gate signal Vgate is output.

The pull-up transistor Tup can be turned on by the voltage at node Q and output a gate signal Vgate having a high level voltage VGH in a high level period of the clock signal CLK to the gate signal node Nout.

The gate signal Vgate of the high level voltage VGH output to the gate signal output node Nout can be supplied to the corresponding gate line GL.

The pull-down transistor Tdown is electrically connected between the gate signal output node Nout and a base voltage node Nvss, and can be turned on or off by the voltage at node QB.

The gate node of the pull-down transistor Tdown is electrically connected to node QB. The drain node or the source node of the pull-down transistor Tdown is electrically connected to the base voltage node Nvss to receive a low-level voltage VSS corresponding to a constant voltage. The source node or drain node of the pull-down transistor Tdown is electrically connected to the gate signal output node Nout from which a gate signal Vgate is output.

The pull-down transistor Tdown can be turned on by the voltage at node QB, and output a gate signal Vgate of the low level voltage VGL to the gate signal output node Nout. Thus, the gate signal Vgate of the low level voltage VGL can be supplied to the corresponding gate line GL through the gate signal output node Nout. Here, the gate signal Vgate of the low level voltage VGL may be, for example, a low-level voltage VSS.

Meanwhile, the control switch circuit CSC may include two or more transistors, and include nodes such as node Q, node QB, a set node (S, also referred to as a start node), a reset node R, and the like. In some aspects, the control switch circuit CSC may further include an input node to which various voltages such as a driving voltage VDD, and the like are input.

In the control switch circuit CSC, node Q is electrically connected to the gate node of the pull-up transistor Tup, and charging and discharging across node Q are repeated.

In the control switch circuit CSC, node QB is electrically connected to the gate node of the pull-down transistor Tdown, and charging and discharging across node QB are repeated.

In the control switch circuit CSC, the set node S can receive a set signal SET for instructing an initiation of gate driving of a corresponding gate driving circuit GDC.

Here, the set signal SET applied to the set node SET may be a start signal VST input from the outside of the gate driver GDR, or may be a signal (carry signal) that is fed back of a gate signal Vgate output from a gate driving circuit GDC in a stage previous to a gate driving circuit GD in the current stage.

The reset signal RST applied to the reset node R from the control switch circuit CSC may be a reset signal for simultaneously initializing gate driving circuits GDC in all stages, or may be a carry signal input from other stages (previous or subsequent stages).

The control switch circuit CSC enables charging across node Q to be performed in response to the set signal SET, and discharging across node Q to be performed in response to the reset signal RST. The control switch circuit CSC may include an inverter circuit for enable charging or discharging across each of node Q and node QB to be performed at respective different timings.

As shown in FIG. 3, the driving transistor T3 and the switching transistor O-SWT may be disposed in each of a plurality of sub-pixels SP in the active area A/A of the panel PNL that may be the OLED panel. However, aspects described herein are not limited thereto. As illustrated in FIG. 4, three or more transistors may be disposed in the active area A/A of the panel PNL that may be the OLED panel.

Further, as shown in FIG. 2, when the gate driving circuit GDC is implemented in the GIP type, that is, when the gate driving circuit GDC is embedded in the panel PNL, several transistors (e.g., Tup, Tdown, and transistors in the control switch circuit CSC) included in the gate driving circuit GDC as shown in FIG. 5 may be disposed in the non-active region N/A that is an edge area of the active region A/A of the panel PNL.

Figure 6A:
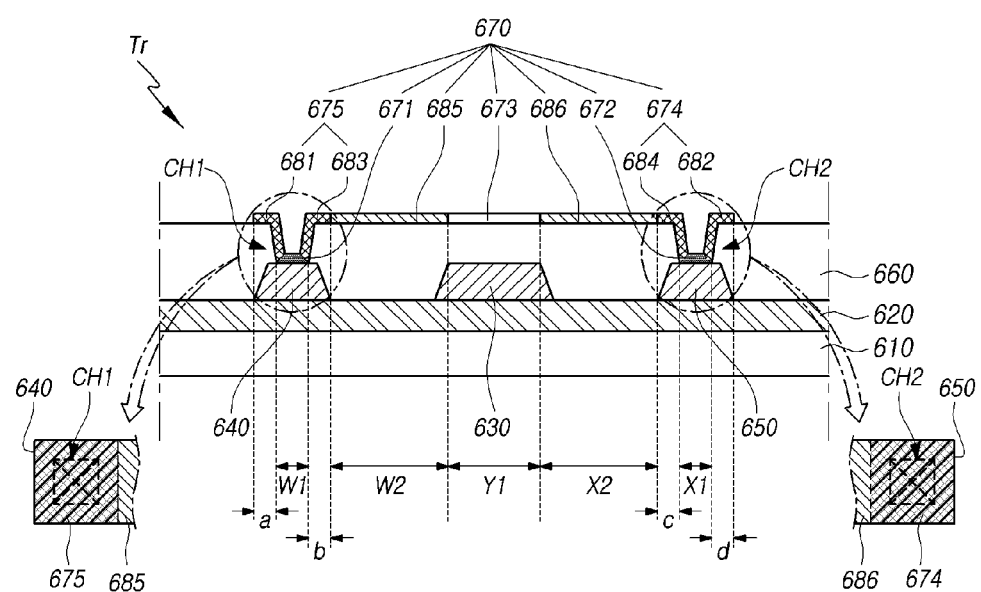
FIGS. 6A and 6B are cross-sectional views illustrating structures of thin film transistors disposed in the electronic device according to aspects of the present disclosure.
Figure 6B:
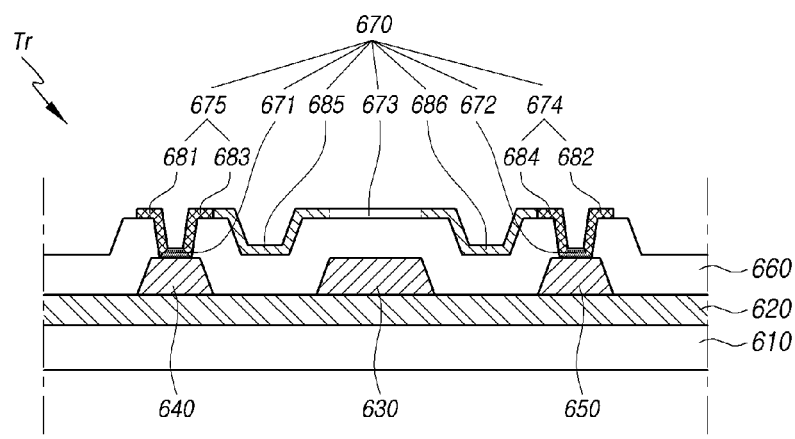
Figure 7:
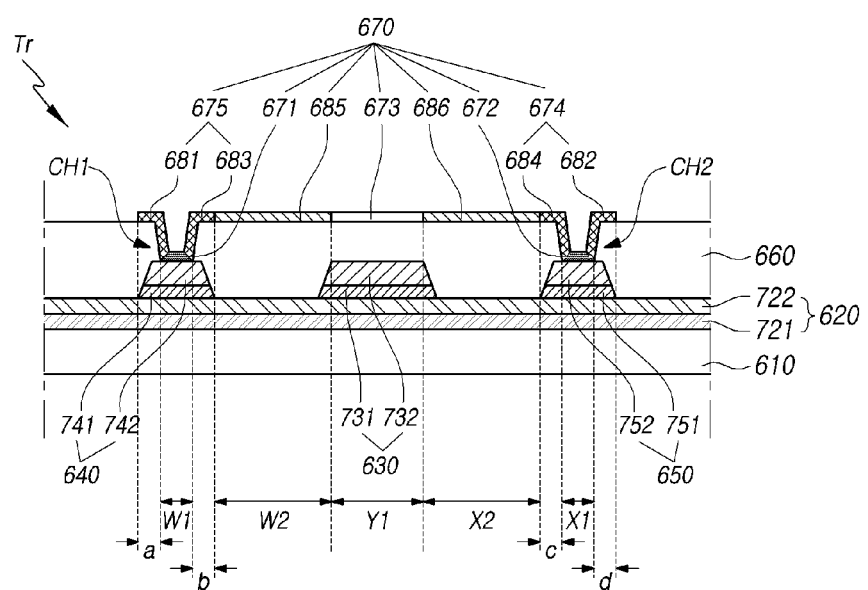
FIG. 7 is a cross-sectional view illustrating a structure of a thin film transistor disposed in the electronic device according to aspects of the present disclosure.

FIGS. 6A and 6B are cross-sectional views illustrating structures of thin film transistors disposed in the electronic device according to aspects of the present disclosure. FIG. 7 is a cross-sectional view illustrating a structure of a thin film transistor disposed in the electronic device according to aspects of the present disclosure.

A plurality of thin film transistors may be disposed in the electronic device according to aspects of the present disclosure. In some aspects, at least one of the thin film transistors shown in FIGS. 6A, 6B, and 7 may be disposed in the electronic device.

At least one thin film transistor Tr included in the electrode device according to aspects of the present disclosure may include a gate electrode 630, a first electrode 640, a second electrode 650, and an active layer 670.

The stacked structure of the thin film transistor Tr is described in detail below.

A conductive auxiliary layer 620 may be disposed on a substrate 610.

The conductive auxiliary layer 620 may include an inorganic insulating material such as silicon nitride (SiNx), silicon oxynitride (SiON), or the like; however, aspects of the present disclosure are not limited thereto.

Although FIGS. 6A and 6B illustrate that the conductive auxiliary layer 620 has a single layer; however, aspects of the present disclosure are not limited thereto. For example, the conductive auxiliary layer 620 may have multiple layers as shown in FIG. 7.

Specifically, the conductive auxiliary layer 620 may include a first conductive auxiliary layer 721 disposed on the substrate 610, and a second conductive auxiliary layer 722 disposed on the first conductive auxiliary layer 721.

In some aspects, one of the first conductive auxiliary layer 721 and the second conductive auxiliary layer 722 may include an inorganic insulating material such as silicon nitride (SiNx), silicon oxynitride (SiON), or the like, and the other one may include an inorganic insulating material such as silicon oxide (SiOx), silicon nitride (SiNx), silicon oxynitride (SiON), or the like. However, aspects of the present disclosure are not limited thereto.

In some aspects, the conductive auxiliary layer 620 may be made up of three or more layers.

Although not shown in FIGS. 6A, 6B and 7, at least one light blocking layer may be further disposed on or over the substrate 610.

The light blocking layer may be disposed between the substrate 610 and the active layer 670 of the thin film transistor Tr to protect the active layer 670 from external factors (e.g., external light, etc.).

The light blocking layer may include any one of either a metal such as aluminum (Al), gold (Au), silver (Ag), copper (Cu), tungsten (W), molybdenum (Mo), chromium (Cr), tantalum (Ta), titanium (Ti), or the like, which can absorb or reflect light, or an alloy including one or more of aluminum (Al), gold (Au), silver (Ag), copper (Cu), tungsten (W), molybdenum (Mo), chromium (Cr), tantalum (Ta), titanium (Ti); however, aspects of the present disclosure are not limited thereto.

The gate electrode 630, the first electrode 640, and the second electrode 650 of the thin film transistor Tr may be disposed on the conductive auxiliary layer 620.

In one aspect, the first electrode 640 may be the source electrode of the thin film transistor Tr, and the second electrode 650 may be the drain electrode of the thin film transistor Tr.

In another aspect, the first electrode 640 may be the drain electrode of the thin film transistor Tr, and the second electrode 650 may be the source electrode of the thin film transistor Tr.

The gate electrode 630, the first electrode 640, and the second electrode 650 may be disposed in the same layer and may be spaced apart from one another.

In some aspects, the gate electrode 630, the first electrode 640, and the second electrode 650 may include one or more materials corresponding to one another.

For example, the gate electrode 630, the first electrode 640, and the second electrode 650 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy including one or more of aluminum (Al), gold (Au), silver (Ag), copper (Cu), tungsten (W), molybdenum (Mo), chromium (Cr), tantalum (Ta), or titanium (Ti). Specifically, the gate electrode 630, the first electrode 640, and the second electrode 650 may include any one of titanium (Ti) or an alloy including titanium (Ti).

Although FIGS. 6A and 6B illustrate that the gate electrode 630, the first electrode 640, and the second electrode 650 have a single layer; however, aspects of the present disclosure are not limited thereto. For example, the gate electrode 630, the first electrode 640, and the second electrode 650 may have two or more layers.

At least one of the gate electrode 630, the first electrode 640, and the second electrode 650 may have multiple layers.

For example, referring to FIG. 7, the gate electrode 630 includes a first gate electrode 731 disposed on the conductive auxiliary layer 620, and a second gate electrode 732 disposed on the first gate electrode 731.

The first electrode 640 may include a first conductive layer 741 disposed on the conductive auxiliary layer 620 and a second conductive layer 741 disposed on the first conductive layer 741.

The second electrode 650 may include a third conductive layer 751 disposed on the auxiliary conductive layer 620 and a fourth conductive layer 752 disposed on the third conductive layer 751.

The first gate electrode 731, the first conductive layer 741, and the third conductive layer 751 may include one or more of various metal materials. For example, the first gate electrode 731, the first conductive layer 741, and the third conductive layer 751 may include i) any one of either a metal such as aluminum (Al), gold (Au), silver (Ag), copper (Cu), tungsten (W), molybdenum (Mo), chromium (Cr), tantalum (Ta), titanium (Ti), or the like, or an alloy including one or more of aluminum (Al), gold (Au), silver (Ag), copper (Cu), tungsten (W), molybdenum (Mo), chromium (Cr), tantalum (Ta), titanium (Ti), or ii) a transparent conductive material; however, aspects of the present disclosure are not limited thereto.

The second gate electrode 732, the second conductive layer 742, and the fourth conductive layer 752 may include may include any one of titanium (Ti) or an alloy including titanium (Ti); however, aspects of the present disclosure are not limited thereto.

As shown in FIGS. 6A, 6B and 7, the gate insulating film 660 may be disposed on the gate electrode 630, the first electrode 640, and the second electrode 650.

The gate insulating film 660 may include an inorganic insulating material such as silicon oxide (SiOx), silicon nitride (SiNx), silicon oxynitride (SiON), or the like; however, aspects of the present disclosure are not limited thereto.

In some aspects, as shown in FIG. 6B, a shape of a surface of the gate insulating film 660 may depend on the morphology of elements disposed under the gate insulating film 660.

Although FIGS. 6A, 6B, and 7 illustrate that the gate insulating film 660 is made up of a single layer; however, aspects of the present disclosure are not limited thereto. In some aspects, the gate insulating film 660 may be made up of multiple layers.

The active layer 670 of the thin film transistor Tr may be disposed on the gate insulating film 660.

The active layer 670 may be one or more of various types of semiconductor layers.

The active layer 670 may include an oxide semiconductor. A material included in the active layer 670 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the active layer 670 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, aspects of the present disclosure are not limited thereto.

The active layer 670 may include a first region 672, a second region 672 spaced apart from the first region 671, and a channel region 673 that is located between the first region 671 and the second region 1742.

The channel region 673 may be an area of the active layer corresponding to the gate electrode 630.

The first region 671 may be an area of the active layer 670 contacting the first electrode 640. The second region 672 may be an area of the active layer 670 contacting the second electrode 650.

When a metal (for example, titanium (Ti) or molybdenum titanium (MoTi)) having low bond energy (or binding energy) or low formation energy Eformation contacts the active layer 670 that is an oxide semiconductor, such a metal can serve to take away oxygen from an area contacting the second active layer 670.

For example, when the active layer 670 is formed of amorphous indium-gallium-zinc oxide (IGZO), while bonding force between indium, gallium, and zinc, which are metallic materials, is strong, oxygen, which is a non-metallic material, is bound to indium, gallium and zinc with relatively weak bonding force.

When molybdenum titanium (MoTi) having low binding energy or low formation energy contacts the active layer 670, oxygen of the active layer 670 bonded with a weak bonding force is sucked, resulting in oxygen vacancies occurring in the active layer 670.

That is, the oxygen concentration of the first region 671 of the active layer 670 contacting the first electrode 640 and the second region 672 of the active layer 670 contacting the second electrode 650 may be lower than the oxygen concentration of either one or more areas (for example, first to sixth auxiliary regions 681, 682, 683, 684, 685, and 686) of the active layer 670 not overlapping the first electrode 640 and the second region 672, or the channel region 673.

In other words, as oxygen vacancies serving as positive charges are present in the first region 671 and the second region 672 of the active layer 670 contacting the first electrode 691, and the first region 671 and the second region 672 generate electrons to maintain electrical neutrality, and the generated electrons become carriers, therefore, the electrical conductivity of the first region 671 and the second region 672 can increase.

That is, the first region 671 and the second region 672 of the active layer 670 of FIGS. 6A, 6B and 7 may be in a conductorized state due to the presence of oxygen vacancies.

Herein, a situation in which a material becomes modified to act as a conductor is referred to as "conductorized", "conductorizing", or a term similar to this.

In this manner, as the first and second regions 671 and 672 of the active layer 670 contact the first and second electrodes 640 and 650, respectively, therefore, the first and second regions 671 and 672 of the active layer 670 can become conductorized without a separate process. In particular, as the first and second regions 671 and 672 of the active layer 670 can become conductorized without a conductorizing process using plasma, damage to the active layer 670 due to plasma can be prevented.

In contrast, there may be few or no oxygen vacancies in the channel region 673 of the active layer 670. Accordingly, the first region 671 and the second region 672 may have more oxygen vacancies than the channel region 673.

The active layer 670 may include at least one auxiliary region connected to each of the first region 671 and the second region 672.

Hereinafter, the "auxiliary region" means an area having an electrical resistance higher than the first and second regions 671 and 672 and lower than the channel region 673.

Specifically, as shown in FIG. 6A, an auxiliary region 675 (i.e. first and third auxiliary regions) may be disposed in i) a partial area (an area except for an area in which first region 671 is disposed) of a first contact hole CH1 in which the first region 671 of the active layer 670 and the first electrode 640 contact each other, and ii) a periphery of the first contact hole CH1.

An additional auxiliary region 674 (i.e. second and fourth auxiliary regions) may be disposed in i) a partial area (an area except for an area in which second region 672 is disposed) of a second contact hole CH2 in which the second region 672 of the active layer 670 and the second electrode 650 contact each other, and ii) a periphery of the second contact hole CH2.

That is, the auxiliary region 675 may include the first auxiliary region 681 and the third auxiliary region 683, and the auxiliary region 674 may include the second auxiliary region 682 and the fourth auxiliary region 684.

As shown in cross-sectional views of FIGS. 6A, 6B and 7, the active layer 670 may include the first auxiliary region 681 extending from the first region 671 and spaced apart from the channel region 673.

The active layer 670 may include the second auxiliary region 682 extending from the second region 672 and spaced apart from the channel region 673.

Further, the active layer 670 may include the third auxiliary region 683 extending from the first region 671 and disposed between the first region 671 and the channel region 673. The third auxiliary region 683 may be located closer to the channel area 673 than the first auxiliary region 681.

The active layer 670 may include the fourth auxiliary region 684 extending from the second region 672 and disposed between the second region 672 and the channel region 673. The fourth auxiliary region 684 may be located closer to the channel region 673 than the second auxiliary region 682.

As an upper surface of the first electrode 640 exposed through the first contact hole CH1 contacts the first region 671 of the active layer 670, the first and third auxiliary regions 681 and 683 can be spaced apart from the first electrode 640.

Further, as an upper surface of the second electrode 650 exposed through the second contact hole CH2 contacts the second region 672 of the active layer 670, the second and fourth auxiliary regions 682 and 684 can be spaced apart from the second electrode 650.

Meanwhile, as described above, as oxygen vacancies present in the first and second regions 671 and 672 of the active layer 670 can generate carriers, there may occur a concentration gradient of carriers between the first and second regions 671 and 672 and other adjacent areas in the active layer 670.

Accordingly, carrier diffusion may occur from each of the first region 671 and the second region 672 having a high carrier concentration to a corresponding adjacent region in the active layer 670.

As carriers diffuse (or oxygen vacancies diffuse) from the first region 671 of the active layer 670, a resulting conductive area may correspond to the first auxiliary region 681 and the third auxiliary region 683. Further, as carriers diffuse (or oxygen vacancies diffuse) from the second region 672 of the active layer 670, a resulting conductive area may correspond to the second auxiliary region 682 and the fourth auxiliary region 684.

As the first to fourth auxiliary regions 681, 682, 683, and 684 are areas in which carriers (or oxygen vacancies) diffused in the first region 671 or the second region 672 are present, the amount of carriers present in the first to fourth auxiliary regions 681, 682, 683, and 684 may be smaller than the amount of carriers present in the first region 671 and the second region 672. In addition, since almost no carriers exist in the channel region 673, the amount of carriers present in the first to fourth auxiliary regions 681, 682, 683, and 684 may be larger than the amount of carriers in the channel region 673.

Accordingly, the electrical resistance of the first to fourth auxiliary regions 681, 682, 683, and 684 may be lower than the electrical resistance of the channel region 673 and higher than the electrical resistance of the first and second regions 671 and 672.

In some aspects, the active layer 670 may further include a fifth auxiliary region 685 and a sixth auxiliary region 686.

Specifically, the fifth auxiliary region 685 may be disposed between the third auxiliary region 683 of the active layer 670 and the channel region 673, and the sixth auxiliary region 686 may be disposed between the fourth auxiliary region 684 of the active layer 670 and the channel region 673.

In some aspects, the electrical resistance of the fifth auxiliary region 685 and the sixth auxiliary region 686 may be lower than the electrical resistance of the channel region 673.

In some aspects, the electrical resistance of the fifth auxiliary region 685 and the sixth auxiliary region 686 may be higher than the electrical resistance of the channel region 673.

In some aspects, the electrical resistance of the fifth auxiliary region 685 and the sixth auxiliary region 686 may be lower than electrical resistance of the first to fourth auxiliary regions 681, 682, 683, and 684.

The fifth auxiliary region 685 and the sixth auxiliary region 686 may not overlap the gate electrode 630, the first electrode 640, and the second electrode 650. The fifth auxiliary region 685 and the sixth auxiliary region 686 may not overlap the gate electrode 630, the first electrode 640, and the second electrode 650, and overlap the conductive auxiliary layer 620.

The conductive auxiliary layer 620 may include hydrogen.

Hydrogen included in the conductive auxiliary layer 620 may serve to supply hydrogen to the fifth auxiliary region 685 and the sixth auxiliary region 686 of the active layer 670 disposed on the conductive auxiliary layer 620.

The amount of charge of the thin film transistor including the oxide semiconductor may be determined by the content of the hydrogen relative to the composition of one or more metals included in the oxide semiconductor. Since hydrogen can act as a carrier in the oxide semiconductor, the higher the content of the hydrogen, the higher the mobility of charges is.

Thus, as hydrogen is supplied to the fifth and sixth auxiliary regions 685 and 686 of the active layer 670 by the conductive auxiliary layer 620, thereby, electrical resistances of the fifth and sixth auxiliary regions 685 and 686 may be lowered (as the mobility of charges increase).

Meanwhile, one or more other regions except for the fifth auxiliary region 685 and the sixth auxiliary region 686 of the active layer 670, that is, the first region 671, the second region 672, the channel region 673 and each of the first to fourth auxiliary regions 681, 682, 683, and 684 may overlap any one of the gate electrode 630, the first electrode 640, and the second electrode 650.

The gate electrode 630, the first electrode 640, and the second electrode 650 may serve as barriers to prevent hydrogen from being supplied to the active layer 670. Accordingly, the amount of hydrogen supplied to the first region 671, the second region 672, the channel region 673, and the first to fourth auxiliary regions 681, 682, 683, and 684 of the active layer 670 may be smaller than the amount of hydrogen supplied to the fifth auxiliary region 685 and the sixth auxiliary region 686 of the active layer 670.

The area of the active layer 670 according to aspects of the present disclosure may be defined according to location relationships between the gate electrode 630, the first electrode 640, and the second electrode 650.

The first region 671 of the active layer 670 may be an area in which the active layer 670 contacts an upper surface of the first electrode 640. A length W1 of the first region 671 may correspond to a length of an area in which the active layer 670 contacts the first electrode 640.

The second region 642 of the active layer 670 may be an area in which the active layer 670 contacts an upper surface of the second electrode 650. A length X1 of the second region 672 may correspond to a length of an area in which the active layer 670 contacts the second electrode 650.

The channel region 673 of the active layer 670 may be an area in which the active layer 670 overlaps the gate electrode 630. A length Y1 of the channel region 673 may correspond to a length of an upper surface of the gate electrode 640. However, aspects of the present disclosure are not limited thereto, and the length Y1 of the channel region 673 may be changed according to the amount of hydrogen supplied to the fifth and sixth auxiliary regions 685 and 686.

For example, the length Y1 of the channel region 673 may correspond to a length of a lower surface of the gate electrode 640.

The auxiliary region 675 including the first auxiliary region 681 and the third auxiliary region 683 of the active layer 670 may be areas (a, b) in which the active layer 670 overlaps the first electrode 640, but does not contact the first electrode 640. Respective lengths of the first auxiliary region 681 and the third auxiliary region 683 may be the sum of respective lengths of areas disposed on respective side surfaces of the gate insulating film 660 in the first contact hole CH1 and respective lengths of areas disposed on the gate insulating film 660 and disposed in the respective peripheries of the first contact hole CH1.

The auxiliary region 674 including the second auxiliary region 682 and the fourth auxiliary region 684 of the active layer 670 may be areas (c, d) in which the active layer 670 overlaps the second electrode 650, but does not contact the second electrode 650. Respective lengths of the second auxiliary region 682 and the fourth auxiliary region 684 may be the sum of respective lengths of areas disposed on respective side surfaces of the gate insulating film 660 in the second contact hole CH2 and respective lengths of areas disposed on the gate insulating film 660 and disposed in the respective peripheries of the second contact hole CH2.

Each of the fifth auxiliary region 685 and the sixth auxiliary region 686 of the active layer 670 may be an area in which the active layer 670 does not overlap the gate electrode 630, the first electrode 640, and the second electrode 650, and overlaps the conductive auxiliary layer 620 disposed under the active layer 670.

In other words, a length W2 of the fifth auxiliary region 685 may correspond to a separation distance between the first electrode 640 and the gate electrode 630. Further, a length X2 of the sixth auxiliary region 686 may correspond to a separation distance between the second electrode 650 and the gate electrode 630.

In the above description, the respective lengths of the first region 671, the second region 672, the channel region 673, the fifth auxiliary region 685, and the sixth auxiliary region 686 are lengths based on a direction perpendicular to in a direction in which the gate insulating film 660 and the active layer 670 are stacked over the substrate 610.

Further, in the lengths of the first to fourth auxiliary regions 681, 682, 683, and 684, the respective lengths of the areas disposed on the side surfaces of the gate insulating film 660 in the contact holes CH1 and CH2 of the gate insulating film 660 are lengths based on the direction in which the gate insulating film 660 and the active layer 670 are stacked over the substrate 610, and the respective lengths of the areas disposed on the gate insulating film 660 and disposed in the peripheries of the second contact holes CH1 and CH2 are lengths based on the direction perpendicular to in the direction in which the gate insulating film 660 and the active layer 670 are stacked over the substrate 610.

As described above, the first and second regions 671 and 672 of the active layer 670 according to the aspects shown in FIGS. 6A, 6B and 7 may be conductive areas due to the presence of oxygen vacancies.

Further, the first to fourth auxiliary regions 681, 682, 683, and 684 of the active layer 670 may be areas in which charges can be transferred due to the presence of oxygen vacancies, but the amount of oxygen vacancies in the first to fourth auxiliary regions 681, 682, 683, and 684 may be smaller than that of the first and second regions 671 and 672.

Further, as the fifth and sixth auxiliary regions 685 and 686 of the active layer 670 include hydrogen, therefore, charges can be transferred in these regions.

Here, each of the respective lengths W2 and X2 of the fifth and sixth auxiliary regions 685 and 686 of the active layer 670 may be longer than each of the respective lengths of the first to fourth auxiliary regions 681, 682, 683 and 684 and the respective lengths W1 and X2 of the first and second regions 671 and 672.

Each of the respective lengths W1 and X1 of the first and second regions 671 and 672 may be longer than each of the respective lengths of the first to fourth auxiliary regions 681, 682, 683, and 684. In other words, the respective lengths of areas of the active layer 670 contacting the first and second electrodes 640 and 650 may be longer than the respective lengths of areas of the active layer 670 overlapping, and not contacting, the first and second electrodes 640 and 650.

That is, each of the first to fourth auxiliary regions 681, 682, 683, and 684 among the remaining regions except for the channel region 673 of the active layer 670 may have a shortest length.

Next, discussions on an electrical resistance of each region of the active layer 670 are conducted.

Figure 8:
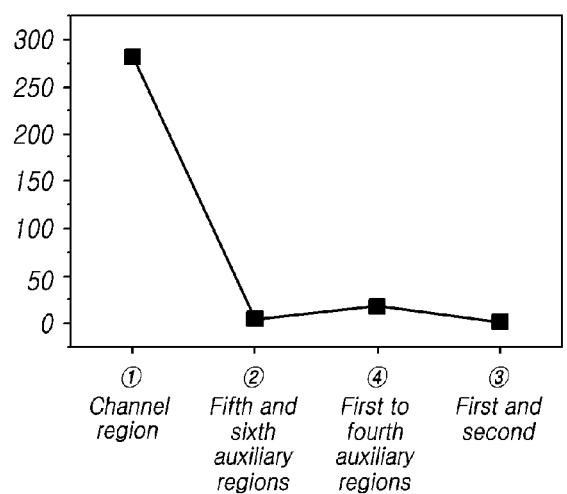
FIG. 8 is a graph showing electrical resistances of respective regions of an active layer shown in FIG. 7.

FIG. 8 is a graph showing electrical resistances of respective regions of the active layer shown in FIG. 7.

In FIG. 8, an X-axis represents each region of the active layer of FIG. 7, and a Y-axis represents of electrical resistance values.

Referring to FIG. 8, the electrical resistance of the channel region 673 of the active layer 670 of FIG. 7 may be larger than those of the first and second regions 671 and 672 and the first to sixth auxiliary regions 681, 682, 683, 684, 685, 686.

Electrical resistances of the first and second regions 671 and 672 of the active layer 670 may be smaller than those of the first to sixth auxiliary regions 681, 682, 683, 684, 685, and 686.

Electrical resistances of the fifth and sixth auxiliary regions 685 and 686 may be smaller than those of the first to fourth auxiliary regions 681, 682, 683 and 684.

That is, among the remaining regions except for the channel region 673 of the active layer 670, the first and second regions 671 and 672 may have the highest charge mobility, and the first to fourth auxiliary regions 681 and 682, 683, 684 may have the lowest charge mobility.

Further, since the first to fourth auxiliary regions 681, 682, 683, and 684 have the highest electrical resistance among the remaining regions of the active layer 670 except for the channel region 673, the charge mobility of the thin film transistor Tr can be prevented from being lowered by designing the first to fourth auxiliary regions 681, 682, 683, and 684 to have a relative short length.

Next, discussions on a manufacturing process of the thin film transistor according to aspects of the present disclosure are conducted.

FIGS. 9 to 12 schematically illustrate a manufacturing process of the thin film transistor according to aspects of the present disclosure.

In the following description, discussions are conducted by focusing on a manufacturing process of the thin film transistor shown in FIG. 6A; however, this is merely for convenience of description, such a process can be equally applied to all transistors described herein.

In the following description, some configurations, effects etc. of the aspects or examples discussed above may not be repeatedly described for convenience of description.

Figure 9:
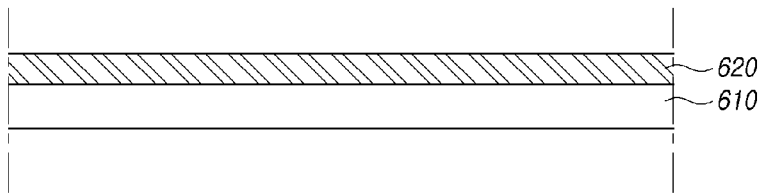
FIGS. 9 to 12 schematically illustrate a manufacturing process of the thin film transistor according to aspects of the present disclosure.

Referring to FIG. 9, the conductive auxiliary layer 620 may be disposed on the substrate 610.

Figure 10:
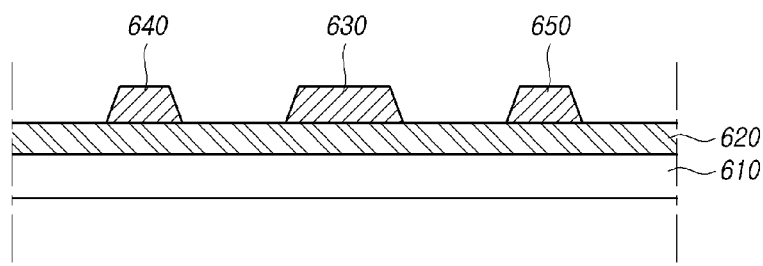

Thereafter, as shown in FIG. 10, The gate electrode 630, the first electrode 640, and the second electrode 650 of the thin film transistor Tr may be disposed on the conductive auxiliary layer 620.

Specifically, an electrode material may be formed on the conductive auxiliary layer 620, and the gate electrode 630, the first electrode 640, and the second electrode 650 disposed to be spaced apart from one another may be formed by patterning the electrode material through an exposure process using a mask.

Figure 11:
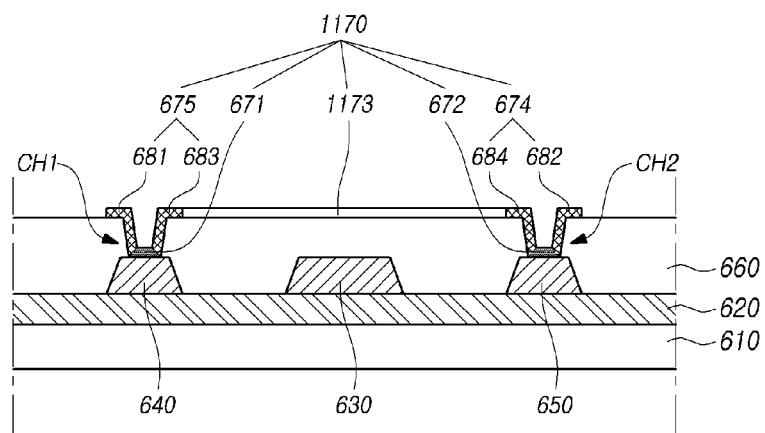

Thereafter, as shown in FIG. 11, the gate insulating film 660 may be formed over the substrate 610 over which the gate electrode 630, the first electrode 640, and the second electrode 650 are disposed.

Specifically, a gate insulating film material may be formed over the substrate 610, and thereafter, through an exposure process using a mask, the gate insulating film 660 having the first contact hole CH1 exposing a part of an upper surface of the first electrode 640 and the second contact hole CH2 exposing a part of an upper surface of the second electrode 650 may be formed.

An active layer material 1170 may be formed on a part of the gate insulating film 660. The active layer material 1170 may also be formed in the first contact hole CH1 and the second contact hole CH2 formed in the gate insulating film 660.

Oxygen vacancies may occur in areas where the active layer material 1170 contacts the first electrode 640 through the first contact hole CH1 and contacts the second electrode 650 through the second contact hole CH2.

Here, the area in which the active layer material 1170 contacts the first electrode 640 may become the first region 671 of the active layer, and the area in which the active layer material 1170 contacts the second electrode 650 may become the second region 672. The first region 671 and the second region 672 may be converted to the same state as a conductive state without a separate process.

Thereafter, oxygen vacancies present in the first region 671 and the second region 672 may diffuse into the auxiliary regions 674 and 675 including the first to fourth auxiliary regions 681, 682, 683 and 684.

As a result, charges may easily move in the first to fourth auxiliary regions 681, 682, 683, and 684, and in particular, move in even the second and third auxiliary regions 682 and 683.

The active layer material 1170 may include a non-conductive region 1173 disposed between the auxiliary regions 674 and 675.

The non-conductive region 1173 may be an area in which electric charges may not easily move due to a very high electrical resistance.

Figure 12:
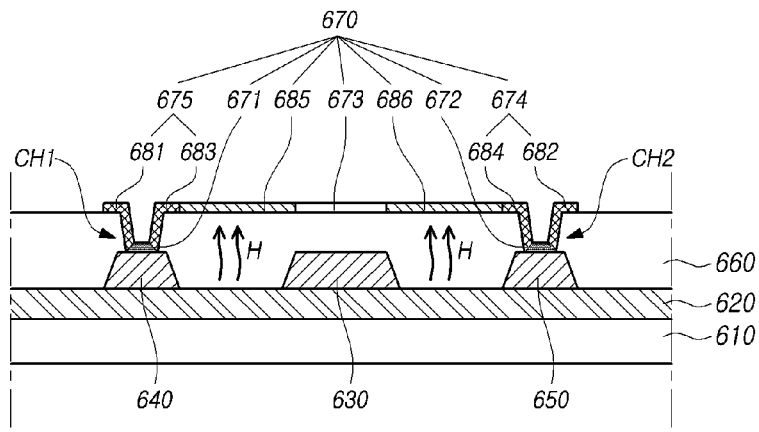

Thereafter, as shown in FIG. 12, heat treatment may be performed for the substrate 610 over which the active layer material.

During the heat treatment, hydrogen may be generated from the conductive auxiliary layer 620 including hydrogen and supplied to the active layer material.

In this situation, a heat treatment temperature may be higher than a temperature applied in the process of forming the active layer material. For example, the heat treatment temperature may be selected in the range of 250° C. to 450° C.; however, aspects of the present disclosure are not limited thereto. In this instance, when the heat treatment temperature is lower than the temperature applied in the process of forming the active layer material, the amount of hydrogen generated from the conductive auxiliary layer 620 may be very small, and therefore, hydrogen may not be sufficiently supplied to the active layer material. In contrast, when the heat treatment temperature is too high, the active layer material over the substrate 610 may be deformed.

Most of the hydrogen generated from the conductive auxiliary layer 620 may be supplied to the active layer material disposed in an area between the first electrode 640 and the gate electrode 630 and an area between the gate electrode 630 and the second electrode 650.

The area of the active layer material to which the hydrogen generated from the conductive auxiliary layer 620 is supplied may be the fifth auxiliary region 685 and the sixth auxiliary region 686 of the active layer 670. Here, the fifth auxiliary region 685 may be an area corresponding between the first electrode 640 and the gate electrode 630, and the sixth auxiliary region 686 may be an area corresponding between the gate electrode 630 and the second electrode 650.

Meanwhile, as the first electrode 640 and the second electrode 650 serve as barriers to prevent hydrogen from being supplied to the active layer 670, thus, the amount of hydrogen supplied to the areas of the active layer 670 overlapping the gate electrode 630, the first electrode 640, and the second electrode 650 may be smaller than the amount of hydrogen supplied to the fifth and sixth auxiliary regions 685 and 686.

As the gate electrode 630 can cause hydrogen to be supplied to area of the active layer 670 corresponding to the gate electrode 630 and thus, prevent a decrease in electrical resistance thereof, even if a heat treatment process for the active layer 670 is performed, it is possible to suppress degradation of the performance of the channel region 673.

Further, as the gate electrode 630 causes hydrogen to be supplied from the conductive auxiliary layer 620 to the channel region 673 of the active layer 670 and thus prevents a decrease in electrical resistance thereof, and causes hydrogen to be supplied to the fifth and sixth auxiliary regions 685 and 686 of the active layer 670 present in an area between the first electrode 640 and the gate electrode 630 and an area between the gate electrode 630 and the second electrode 650 and thus leads to being converted to the same state as a conductorized state, it is possible to provide an effect that the electrical characteristics of the thin film transistor can be stabilized.

Discussions on electrical characteristics of the thin film transistor according to aspects of the present disclosure are conducted as follows.

Figure 13:
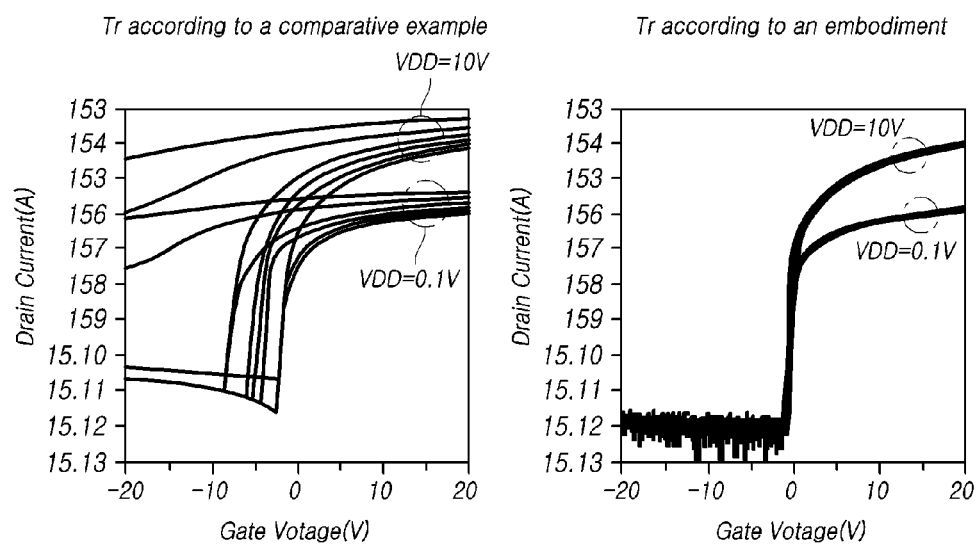
FIG. 13 is a graph showing changes in drain currents according to changes in gate voltages of a thin film transistor in a comparative example and the thin film transistor in the aspect described herein.

FIG. 13 is a graph showing changes in drain currents according to changes in gate voltages of a thin film transistor in a comparative example and the thin film transistor in the aspect described herein.

In the following description, some configurations, effects etc. of the aspects or examples discussed above may not be repeatedly described for convenience of description.

In FIG. 13, the thin film transistor of the comparative example may be a typical thin film transistor with a structure in which a gate insulating film is disposed on an active layer, a gate electrode is disposed on the gate insulating film, first and second electrodes are disposed on the gate electrode, and a hydrogen supply layer (e.g., a conductive auxiliary layer) is disposed between the gate electrode and the first and second electrodes. Here, the active layer may include a source region and a drain region that are conductorized regions, and the source region and the drain region can be conductorized through hydrogen supplied from the hydrogen supply layer.

The thin film transistor according to the aspect may be the thin film transistor shown in FIG. 7.

To measure the respective characteristics of the thin film transistor of the comparative example and the thin film transistor of the aspect, drain currents were measured while applying a gate voltage in the range of −20 V to +20 V, and as shown in FIG. 13, a driving voltage (VDD) of 0.1 V and a driving voltage of 10 V were applied to the respective thin film transistors of the comparative example and the aspect.

In the case of the transistor of the comparative example, although the source region and the drain region of the active layer can be conductorized through hydrogen delivered through the hydrogen supply layer, it is necessary to conductorize the source region and the drain region based on only the deposition conditions of the hydrogen supply layer. Accordingly, it is difficult to supply an appropriate amount of hydrogen to the active layer.

In particular, when an additional heat treatment is performed after the conductive auxiliary layer, which is the hydrogen supply layer, disposed on the active layer, is formed to conductorize the source and drain regions of the active layer, since only the gate electrode is provided as an element serving as a barrier for preventing hydrogen supply, hydrogen may excessively permeate into the active layer.

As a result, as shown in FIG. 13, it can be seen that the distribution of the drain current is relatively large. In other words, it can be seen that it is difficult to actually employ this example because the characteristics of the thin film transistor of the comparative example are varied.

On the other hand, the thin film transistor of the aspect has a structure in which the gate electrode 630, the first electrode 640, and the second electrode 650 are spaced apart from one another on the conductive auxiliary layer 620 supplying hydrogen to the active layer 670, and the active layer 670 is disposed on the gate electrode 630, the first electrode 640, and the second electrode 650.

Further, as the gate electrode 630, the first electrode 640, and the second electrode 650 serve as barriers to prevent hydrogen from being supplied to the active layer 670, therefore, hydrogen can be caused to be intensively supplied to the fifth auxiliary region 685 and the sixth auxiliary region 686 of the active layer 670 by a heat treatment process, and each of the fifth auxiliary region 685 and the sixth auxiliary region 686 can be caused to have a uniform hydrogen content.

Accordingly, as shown in FIG. 13, it can be seen that the distribution of the drain current of the thin film transistor of the aspect is relatively small.

In other words, it can be seen that the characteristics of the thin film transistor of the aspect are superior to the characteristics of the thin film transistor of the comparative example.

Each of the thin film transistors (e.g., the thin film transistors having the structure of FIGS. 6A and 7) according to aspects describe herein may be used as at least one of the transistors shown in FIGS. 3 to 5.

Figure 14:
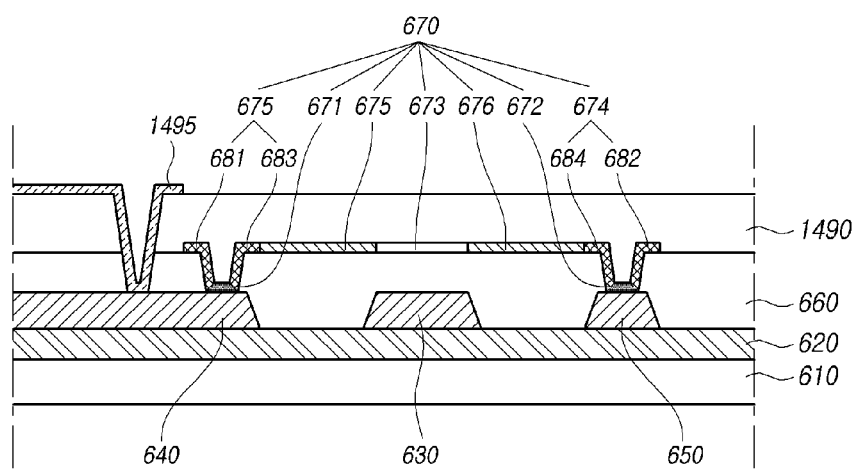
FIG. 14 illustrates a structure of a thin film transistor connected to a pixel electrode when the transistor is disposed in a sub-pixel of the panel according to aspects of the present disclosure.

Meanwhile, when each of the thin film transistors according to aspects describe herein is used as the driving transistor shown in FIGS. 3 and 4, such a transistor may have a structure shown in FIG. 14.

FIG. 14 illustrates a structure of a thin film transistor connected to a pixel electrode when the transistor is disposed in a sub-pixel of the panel according to aspects of the present disclosure.

In the following description, some configurations, effects etc. of the aspects or examples discussed above may not be repeatedly described for convenience of description.

Referring to FIG. 14, at least one of thin film transistors Tr1 disposed in a sub-pixel SP in the active area A/A of the panel may have a configuration in which a first electrode 640 of the at least one thin film transistors Tr1 is needed to be electrically connected to a pixel electrode 1495.

A passivation film 1490 may be disposed on an active layer 670 of such a thin film transistor Tr.

The pixel electrode 1495 may be disposed on the passivation layer 1490. The pixel electrode 1695 may be electrically connected to the first electrode 640 of the thin film transistor Tr1 through a contact hole formed in the passivation layer 1490.

Here, the first electrode 640 may be a source electrode or a drain electrode of the thin film transistor Tr1.

Although FIG. 14 illustrates a configuration in which the thin film transistor Tr1 is disposed in the active region A/A; however, aspects of the present disclosure are not limited thereto. For example, the thin film transistor Tr1 according to aspects described herein may also be disposed in the non-active area N/A, which is an edge of the panel (when the electronic device is a display device).

Further, although FIG. 14 illustrates a structure in which the thin film transistor Tr1 having the structure illustrated in FIG. 6A is electrically connected to the pixel electrode 1495; however, aspects of the present disclosure are not limited thereto. For example, at least one of the thin film transistors Tr1 having structures according to aspects described herein including FIG. 7 may be electrically connected to the pixel electrode 1495.

Figure 15:
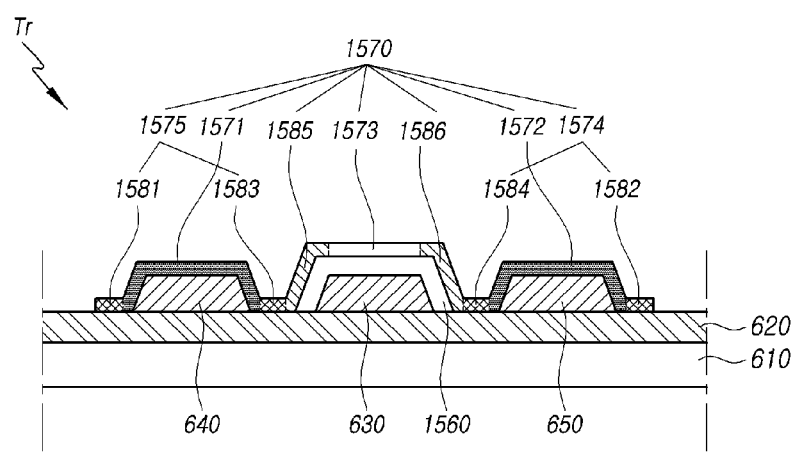
FIGS. 15 and 16 illustrate structures of thin film transistors disposed in an electronic device according to aspects of the present disclosure.
Figure 16:
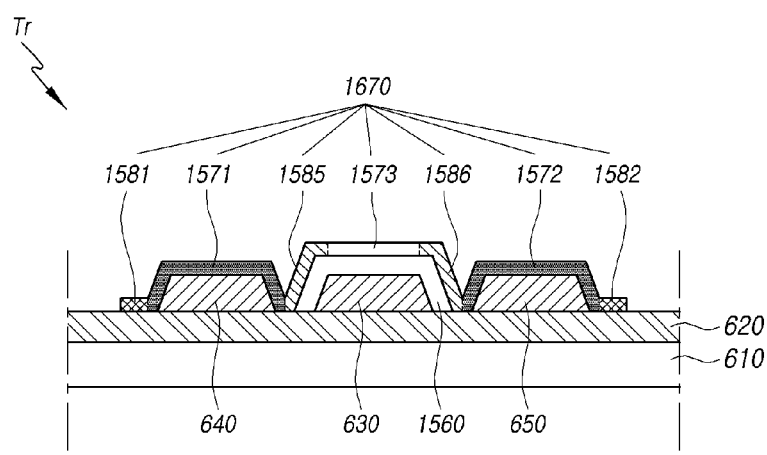

The structures of the thin film transistors according to aspects described herein are not limited to structures in FIGS. 6A and 7, and may include the structures shown in FIGS. 15 and 16.

FIGS. 15 and 16 illustrate structures of thin film transistors disposed in an electronic device according to aspects of the present disclosure.

In the following description, some configurations, effects etc. of the aspects or examples discussed above may not be repeatedly described for convenience of description.

Referring to FIGS. 15 and 16, a conductive auxiliary layer 620 may be disposed on a substrate 610.

A gate electrode 630, a first electrode 640, and a second electrode 650 of the thin film transistor Tr may be disposed on the conductive auxiliary layer 620.

A gate insulating film 1560 may be disposed on or over the gate electrode 630 and the conductive auxiliary layer 620.

Here, the gate insulating film 1560 may not overlap the first electrode 640 and the second electrode 650.

Specifically, the gate insulating film 1560 may be disposed to surround an upper surface and one or more side surfaces of the gate electrode 630.

An active layer 1570 of the thin film transistor Tr may be disposed on or over the gate insulating film 1560, the first electrode 640, the second electrode 650, and the conductive auxiliary layer 620.

The active layer 1570 may contact an upper surface and one or more side surfaces of each of the first electrode 640 and the second electrode 650.

Further, the active layer 1570 may be disposed to surround an upper surface and one or more side surfaces of the gate insulating film 1560.

The active layer 1570 may also contact a part of an upper surface of the conductive auxiliary layer 620. For example, the active layer 1570 may contact the upper surface of the conductive auxiliary layer 620 in an area between the first electrode 640 and the gate insulating film 1560, and may contact the upper surface of the conductive auxiliary layer 620 in an area between the second electrode 650 and the gate insulating film 1560.

The active layer 1570 may include a first region 1571, a second region 1572, a channel region 1573, and first to sixth auxiliary regions 1581, 1582, 1583, 1584, 1585, and 1586.

The channel region 1573 of the active layer 1570 may be disposed at a location corresponding to the gate electrode 1530.

The first region 1571 of the active layer 1570 may contact the first electrode 640. In other words, the first region 1571 may correspond to the entire upper surface and the entire one or more side surfaces of the first electrode 640.

The second region 1572 of the active layer 1570 may contact the second electrode 650. In other words, the second region 1572 may correspond to the entire upper surface and the entire one or more side surfaces of the second electrode 650.

Respective lengths of the first region 1571 and the second region 1572 may be proportional to the respective lengths and heights of the first electrode 640 and the second electrode 650. That is, the respective lengths of the first region 1571 and the second region 1572 may be determined by the respective lengths and heights of the first electrode 640 and the second electrode 650.

The first region 1571 and the second region 1572 of the active layer 1570 may be present in a conductive state due to the presence of oxygen vacancies.

An auxiliary region 1573 including the first auxiliary region 1581 and the third auxiliary region 1583 may be disposed in peripheries of the first region 1571 of the active layer 1570.

The first auxiliary region 1581 may extend from the first region 1571 of the active layer 1570 and may be spaced apart from the channel region 1573. The first auxiliary region 1581 may contact an upper surface of the conductive auxiliary layer 620.

The third auxiliary region 1583 may extend from the first region 1571 and may be disposed between the first region 1571 and the channel region 1573. The third auxiliary region 1583 may be disposed in a part of an area between the first electrode 640 and the gate electrode 630 and may contact the upper surface of the conductive auxiliary layer 620.

Further, an auxiliary region 1574 including the second auxiliary region 1582 and the fourth auxiliary region 1584 may be disposed in peripheries of the second region 1572 of the active layer 1570.

The second auxiliary region 1582 may extend from the second region 1572 of the active layer 1570 and may be spaced apart from the channel region 1573. The second auxiliary region 1582 may contact the upper surface of the conductive auxiliary layer 620.

The fourth auxiliary region 1584 may extend from the second region 1572 and may be disposed between the second region 1572 and the channel region 1573. The fourth auxiliary region 1584 may be disposed in a part of an area between the second electrode 650 and the gate electrode 630 and may contact the upper surface of the conductive auxiliary layer 620.

Here, the first and third auxiliary regions 1581 and 1583 may be areas in which oxygen vacancies are diffused from the first region 1571. The second and fourth auxiliary regions 1582 and 1584 may be areas in which oxygen vacancies diffuse from the second region 1572.

Meanwhile, referring to FIG. 15, the thin film transistor may include the fifth auxiliary region 1585 disposed between the third auxiliary region 1583 and the channel region 1573 of the active layer 1570, and the sixth auxiliary region 1586 disposed between the fourth auxiliary region 1584 and the channel region 1573.

In the cross-section, the fifth auxiliary region 1585 may be disposed on one side surface of the gate insulating film 1560. Further, the fifth auxiliary region 1585 may be disposed on a part of an upper surface of the gate insulating film 1560.

The sixth auxiliary region 1586 may be disposed on another side surface of the gate insulating film 1560. The sixth auxiliary region 1586 may be also disposed on a part of an upper surface of the gate insulating film 1560.

The channel region 1573 of the active layer 1570 may be disposed between the fifth auxiliary region 1585 and the sixth auxiliary region 1586.

Hydrogen may be supplied from the conductive auxiliary layer 620 including hydrogen to the first to sixth auxiliary regions 1581, 1582, 1583, 1584, 1585, and 1586 of the active layer 1570.

Specifically, when a material of the active layer 1570 is formed on the substrate 610 and then heat treatment is performed, hydrogen present in the conductive auxiliary layer 620 can be penetrated into areas corresponding to the first to sixth auxiliary regions 1581, 1582, 1583, 1584, 1585, and 1586.

Further, hydrogen can be supplied to the first region 1571 and the second region 1572 of the active layer 1570.

For example, hydrogen can be also supplied from the conductive auxiliary layer 620 to a part of the first region 1571 and a part of the second region 1572 of the active layer 1570. Hydrogen supplied to the first region 1571 and the second region 1572 of the active layer 1570 may be present in a uniform amount in the first and second regions 1571 and 1572 through a heat treatment process.

Further, hydrogen supplied to the first to sixth auxiliary regions 1581, 1582, 1583, 1584, 1585, and 1586 may be also present in a uniform amount in each region through the heat treatment process, and therefore, the electrical characteristics of the thin film transistor can be prevented from being varied.

Meanwhile, although FIG. 15 illustrates that the third auxiliary region 1583 of the active layer 1570 is disposed between the gate electrode 630 and the first electrode 640, and the fourth auxiliary region 1584 of the active layer 1570 is disposed between the gate electrode 630 and the second electrode 650; however, the structures of the thin film transistors Tr according to aspects of the present disclosure are not limited thereto.

A length of the third auxiliary region 1583 of the active layer 1570 may be determined according to a separation distance between the gate electrode 630 and the first electrode 640, and a length of the fourth auxiliary region 1584 may be determined according to a separation distance between the gate electrode 630 and the second electrode 640.

Further, as shown in FIG. 16, when a separation distance between the gate electrode 630 and the first electrode 640 and a separation distance between the gate electrode 630 and the second electrode 650 are very short, the third auxiliary region 1583 and the fourth auxiliary region 1584 of the active layer 1670 may not be formed.

In other words, without the third auxiliary region 1583 and the fourth auxiliary region 1584, the first auxiliary region 1581 of the active layer 1670 may extend from a part of the first region 1571, and the fifth auxiliary region 1585 of the active layer 1670 may extend from another part of the first region 1571. Further, the second auxiliary region 1582 of the active layer 1670 may extend from a part of the second region 1572 and the sixth auxiliary region 1586 may extend from another part of the second region 1572.

In FIGS. 15 and 16, the remaining regions except for the channel region 1573 of the active layers 1570 and 1670 may have lower electrical resistance than the channel region 1573 due to oxygen vacancies and hydrogen. Further, the auxiliary regions of the active layers 1570 and 1670 may have a lower electrical resistance than the channel region 1573 and higher electrical resistance than the first and second regions 1571 and 1572.

According to the aspects of the present disclosure, it is possible to provide the thin film transistor array substrate having the structure capable of preventing the active layer from being damaged by plasma when a process for modifying the active layer to act as a conductor is performed by enabling the active layer to include a region contacting each of a first electrode and a second electrode, and the electronic device including the thin film transistor array substrate.

According to the aspects of the present disclosure, it is possible to provide the thin film transistor array substrate having the structure in which current characteristics can be maintained without being changed by including the plurality of auxiliary regions having an electrical resistance lower than that of the channel region, and the electronic device including the thin film transistor array substrate.

According to the aspects of the present disclosure, it is possible to provide the thin film transistor array substrate capable of simplifying a related process by disposing the gate electrode, the first electrode and the second electrode in the same layer, and the electronic device including the thin film transistor array substrate.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An electronic device comprising:
a panel comprising at least one thin film transistor; and
a driving circuit for driving the panel,
wherein the panel further comprising:
a substrate;
an auxiliary layer disposed on the substrate;
a gate electrode and first and second electrodes disposed on the auxiliary layer and spaced apart from one another;
a gate insulating film disposed on the gate electrode; and
an active layer disposed on or over the gate insulating film and the first and second electrodes, and including a first region, a second region spaced apart from the first region, a channel region disposed between the first region and the second region, a first auxiliary region extending from the first region and spaced apart from the channel region, and a second auxiliary region extending from the second region and spaced apart from the channel region,
wherein an electrical resistance of each of the first auxiliary region and the second auxiliary region is lower than that of the channel region and higher than that of each of the first and second regions,
wherein the active layer further comprising:
a third auxiliary region extending from the first region and disposed between the first region and the channel region;
a fourth auxiliary region extending from the second region and disposed between the second region and the channel region;
a fifth auxiliary region disposed between the third auxiliary region and the channel region; and
a sixth auxiliary region disposed between the fourth auxiliary region and the channel region,
wherein an electrical resistance of each of the fifth auxiliary region and the sixth auxiliary region is lower than that of either the channel region or each of the first to fourth auxiliary regions and higher than that of each of the first and second regions.

2. The electronic device according to claim 1, wherein the first region is an area in which the active layer contacts the first electrode, and the second region is an area in which the active layer contacts the second electrode.

3. The electronic device according to claim 1, wherein the first auxiliary region and the second auxiliary region respectively are spaced apart from the first and second electrodes and overlap with the first and second electrodes.

4. The electronic device according to claim 1, wherein an electrical resistance of each of the third auxiliary region and the fourth auxiliary region is lower than that of the channel region and higher than that of each of the first and second regions.

5. The electronic device according to claim 1, wherein the gate insulating film overlaps with the first and second electrodes and includes a first contact hole exposing a part of an upper surface of the first electrode and a second contact hole exposing a part of an upper surface of the second electrode, and
wherein an area in which the active layer contacts the first electrode in the first contact hole is the first region, and an area in which the active layer contacts the second electrode in the second contact hole is the second region.

6. The electronic device according to claim 5, wherein the first auxiliary region overlaps with the first electrode, and the second auxiliary region overlaps with the second electrode, and
wherein the first auxiliary region contacts a part of the gate insulating film in the first contact hole, and the second auxiliary region contacts a part of the gate insulating film in the second contact hole.

7. The electronic device according to claim 6, wherein the first auxiliary region is disposed on the gate insulating film and extends to a periphery of the first contact hole, and the first auxiliary region is disposed on the gate insulating film and extends to a periphery of the second contact hole.

8. The electronic device according to claim 7, wherein the third auxiliary region overlaps with the first electrode, and the fourth auxiliary region overlaps with the second electrode, and
wherein the third auxiliary region includes an area disposed in a part of a side surface of the gate insulating film in the first contact hole, and the fourth auxiliary region includes an area disposed in a part of a side surface of the gate insulating film in the second contact hole.

9. The electronic device according to claim 7, wherein an electrical resistance of each of the first to fourth auxiliary regions is lower than that of the channel region and higher than that of each of the first and second regions.

10. The electronic device according to claim 9, wherein an oxygen concentration of each of the first to fourth auxiliary regions is higher than that of each of the first and second regions.

11. The electronic device according to claim 7,
wherein the fifth auxiliary region is disposed between the first electrode and the gate electrode, and the sixth auxiliary region is disposed between the second electrode and the gate electrode.

12. The electronic device according to claim 11 wherein an oxygen concentration of each of the fifth and sixth auxiliary regions is higher than that of each of the first to fourth regions.

13. The electronic device according to claim 1, wherein the auxiliary layer includes silicon nitride (SiNx) or silicon oxynitride (SiON).

14. An electronic device comprising:
a panel comprising at least one thin film transistor; and
a driving circuit for driving the panel,
wherein the panel further comprising:
a substrate;
an auxiliary layer disposed on the substrate;
a gate electrode and first and second electrodes disposed on the auxiliary layer and spaced apart from one another;
a gate insulating film disposed on the gate electrode; and
an active layer disposed on or over the gate insulating film and the first and second electrodes, and including a first region, a second region spaced apart from the first region, a channel region disposed between the first region and the second region, a first auxiliary region extending from the first region and spaced apart from the channel region, and a second auxiliary region extending from the second region and spaced apart from the channel region,
wherein an electrical resistance of each of the first auxiliary region and the second auxiliary region is lower than that of the channel region and higher than that of each of the first and second regions, and wherein the gate insulating film does not overlap with the first electrode and the second electrode, and the active layer is disposed on at least a part of an upper surface and a side surface of the gate insulating film, an upper surface and a side surface of the first electrode, an upper surface and a side surface of the second electrode, and an upper surface of the auxiliary layer.

15. The electronic device according to claim 14, wherein the first region of the active layer is an area corresponding to the upper surface and the side surface of the first electrode, and
wherein the second region of the active layer is an area corresponding to the upper surface and the side surface of the second electrode.

16. The electronic device according to claim 15, wherein the first auxiliary region and the second auxiliary region of the active layer contact at least a part of the upper surface of the auxiliary layer.

17. The electronic device according to claim 15, wherein the active layer further comprising:
a third auxiliary region extending from the first region and disposed between the first region and the channel region; and
a fourth auxiliary region extending from the second region and disposed between the second region and the channel region, and
wherein an electrical resistance of each of the first to fourth auxiliary regions is lower than that of the channel region and higher than that of each of the first and second regions.

18. The electronic device according to claim 15, wherein the active layer further comprising:
a fifth auxiliary region disposed between the third auxiliary region and the channel region; and
a sixth auxiliary region disposed between the fourth auxiliary region and the channel region, and
wherein the fifth and sixth auxiliary regions include areas disposed on a part or all of the side surface of the gate insulating film and a part of the upper surface of the gate insulating film.

19. The electronic device according to claim 18, wherein an electrical resistance of each of the fifth auxiliary region and the sixth auxiliary region is lower than that of the channel region and higher than that of each of the first and second regions.

20. A thin film transistor array substrate comprising:
a substrate;
an auxiliary layer disposed on the substrate;
a gate electrode disposed on the auxiliary layer;
first and second electrodes disposed in a same layer as the gate electrode and spaced apart from each other;
a gate insulating film disposed on the gate electrode; and
an active layer disposed on or over the gate insulating film and the first and second electrodes, and including a first region, a second region spaced apart from the first region, a channel region disposed between the first region and the second region, a first auxiliary region surrounding the first region, and a second auxiliary region surrounding the second region,
wherein an electrical resistance of each of the first auxiliary region and the second auxiliary region is lower than that of the channel region and higher than that of each of the first and second regions,
wherein the active layer further comprising:
a third auxiliary region extending from the first region and disposed between the first region and the channel region;
a fourth auxiliary region extending from the second region and disposed between the second region and the channel region;
a fifth auxiliary region disposed between the third auxiliary region and the channel region; and
a sixth auxiliary region disposed between the fourth auxiliary region and the channel region, and
wherein an electrical resistance of each of the fifth auxiliary region and the sixth auxiliary region is lower than that of either the channel region or each of the first to fourth auxiliary regions and higher than that of each of the first and second regions.

* * * * *